United States Patent [19]

Yoneda et al.

[11] Patent Number: 5,443,550
[45] Date of Patent: Aug. 22, 1995

[54] ELECTRONIC CIRCUIT APPARATUS, APPARATUS FOR REMOVING ELECTROMAGNETIC WAVE NOISE AND THE METHOD OF MANUFACTURING THE SAME

[75] Inventors: Hiroshi Yoneda, Katsuta; Kaoru Uchiyama, Ibaraki, both of Japan

[73] Assignees: Hitachi, Ltd., Tokyo; Hitachi AUtomotive Engineering Co., Ltd., Ibaraki, both of Japan

[21] Appl. No.: 882,907

[22] Filed: May 14, 1992

[30] Foreign Application Priority Data

May 14, 1991 [JP] Japan .................. 3-107949

[51] Int. Cl.⁶ .......................... G01M 15/00
[52] U.S. Cl. .................. 73/118.2; 333/167
[58] Field of Search ............ 333/167, 172, 175, 176, 333/184, 185, 181, 182; 73/118.2

[56] References Cited

U.S. PATENT DOCUMENTS

| | | | |
|---|---|---|---|
| 2,759,155 | 8/1956 | Hackenberg | 333/181 |
| 4,374,369 | 2/1983 | Sakamoto et al. | 333/182 |
| 4,563,659 | 1/1986 | Sakamoto et al. | 333/182 |
| 4,571,561 | 2/1986 | Fujiki et al. | 333/167 |
| 4,675,629 | 6/1987 | Sakamoto et al. | 333/182 |
| 4,782,310 | 11/1988 | Saburi et al. | 333/167 |

FOREIGN PATENT DOCUMENTS 4035512 2/1992 Japan .................. 333/181

*Primary Examiner*—Robert Raevis
*Attorney, Agent, or Firm*—Antonelli, Terry, Stout & Kraus

[57] ABSTRACT

A noise removing apparatus wherein a π filter is constructed by a pair of feedthrough ceramic capacitors and a lead for connecting the feedthrough ceramic capacitors to each other to improve the radio wave trouble resistance of an electronic equipment and remove a shielding casing. Electrodes are formed on the both sides of a dielectric plate having a plurality of through holes by plating or the like, the electrode on one side is divided into plural ones in correspondence to the number of the through holes, resist portions are formed on the electrode on the other side so as to be in one-to-one correspondence to the through holes to provide a plurality of feedthrough ceramic capacitors, and an arbitrary pair of electrodes on one side are connected to each other through an inductive lead passing through the associated through holes, thereby to construct a π filter.

3 Claims, 8 Drawing Sheets

ELECTRONIC CIRCUIT APPARATUS, APPARATUS FOR REMOVING ELECTROMAGNETIC WAVE NOISE AND THE METHOD OF MANUFACTURING THE SAME

BACKGROUND OF THE INVENTION

The present invention relates to an electronic circuit device for processing a small electric signal, and more particularly to an electronic circuit device having a shielding unit for protection of the circuit from electromagnetic wave noise, and a noise removing apparatus.

Such an electronic circuit device is used in an apparatus for measuring the flow rate of inflow air, an apparatus for measuring a negative pressure of an inlet pipe, an apparatus for measuring acceleration, or the like, for example a device of the type used with an internal combustion engine.

There is described in JP-A-58-6414, JP-A-61-9012, and JP-A-1-97817 an electronic circuit device which is used in an apparatus for measuring the flow rate of inflow air provided in an internal combustion engine.

The electronic circuit device described in the above-referenced patent publications is provided with a shielding casing which is made of metal for surrounding an electronic circuit portion of the device in order to protect the electronic circuit from electromagnetic wave noise, and a feedthrough ceramic capacitor which is used for forming a filter between an I/O signal line and a terminal of a module of the electronic circuit apparatus.

In the prior art electronic circuit device, the provision of the shielding casing prevents the module from being miniaturized or made more compact.

Moreover, the feedthrough ceramic capacitor is fixedly mounted to a supporting plate (some of them also act as a shielding casing) which is perpendicularly mounted to a base of the electronic circuit. Then, since this supporting plate is present even if the shielding casing can be omitted, there is a limit to possible miniaturization of the device.

Further, there arises a problem in which since the fact that, after a high frequency current induced in a wire harness by a strong electric field of high frequency has passed through the feedthrough ceramic capacitor, the current is not attenuated sufficiently in magnitude, with the result that the electronic circuit in the shielding casing malfunctions.

Moreover, there is encountered a problem in that it is difficult to automatically mount the feedthrough ceramic capacitor, not to mention the fact that the mounting of the feedthrough ceramic capacitor hinders the other elements from being automatically assembled.

On the other hand, the output of such an electronic circuit apparatus is fed to a signal processing apparatus which is separately provided. Then, in the prior art apparatus, the form of the output signal is not directly adapted to the signal processing apparatus. Therefore, it may be necessary in some cases to provide a special interface in the I/O port of the signal processing apparatus, and to perform a preprocessing in the processing circuit. In order to solve this problem, the output of the electronic circuit apparatus is preferably outputted through an open-collector type transistor. However, in this case, there arises a problem in that the total impedance of the electronic circuit viewed from the output side is readily influenced by electromagnetic wave noise, and therefore, with the prior art filter, even if a shielding casing is provided, the presence of electromagnetic wave noise superimposed on the output signal line can not be sufficiently provided.

SUMMARY OF THE INVENTION

It is therefore a first object of the present invention to miniaturize or make compact a module of an electronic circuit apparatus by removing the shielding casing and the supporting plate of the feedthrough ceramic capacitor.

It is a second object of the present invention to improve the performance of a filter, thereby to allow an electromagnetic wave noise to be sufficiently eliminated even if the shielding casing of the feedthrough ceramic capacitor is removed.

It is a third object of the present invention to provide an electronic circuit apparatus in which the output signal is hardly influenced by electromagnetic wave noise even if it has a form which is readily accepted by a signal processing apparatus.

The above first object of the present invention is attained by directly mounting a feedthrough ceramic capacitor on a metal plate to which a circuit substrate of the electronic circuit apparatus is mounted.

Preferably, flat feedthrough ceramic capacitors are provided on the metal plate in parallel with one another, and also a space used for accommodating an I/O lead to be inserted into the feedthrough ceramic capacitor is carved on the metal plate.

The above second object of the invention is attained by connecting a $\pi$ type filter between each I/O signal line and an I/O terminal of the module.

The above third object is attained in such a way that an output signal of the electronic circuit apparatus is fed through an open-collector type transistor, and a $\pi$ type filter is connected between an open-collector of that transistor and an output terminal of the module, and also a resistor for adjusting an impedance is connected between the $\pi$ type filter and the collector of that transistor.

According to an aspect of the present invention, the metal plate to which the substrate of the electronic circuit is mounted is also used as the supporting plate to which the feedthrough ceramic capacitor is mounted, whereby the supporting plate becomes unnecessary and thus it is possible to miniaturize and make compact the electronic circuit module.

Moreover, the feedthrough ceramic capacitor is made to be of a flat type capacitor, whereby the positioning thereof can be performed automatically and the noise removing apparatus can be assembled automatically.

According to another aspect of the present invention, since electromagnetic wave noise superimposed on the I/0 signal line of the electronic circuit apparatus can be removed effectively by the $\pi$ type filter, it is possible to sufficiently protect the electronic circuit from electromagnetic wave noise without the need for a shielding casing.

According to still another aspect of the present invention, since the output a signal of the electronic circuit apparatus has signal form which is suitable for the signal processing unit for receiving that output signal, there is no need for providing a special interface in the input port of the signal processing unit. Moreover, although an open-collector type transistor is provided in the I/0 terminal of the electronic circuit, the provision of a resistor for adjusting the impedance viewed from the output terminal side allows the electromagnetic wave noise superimposed on the output signal line of the electronic circuit to be sufficiently removed through the π type filter.

DESCRIPTION OF THE PREFERRED EMBODIMENTS

The preferred embodiments of an air flow meter according to the present invention will hereinafter be described in detail with reference to the accompanying drawings.

Figure 1:
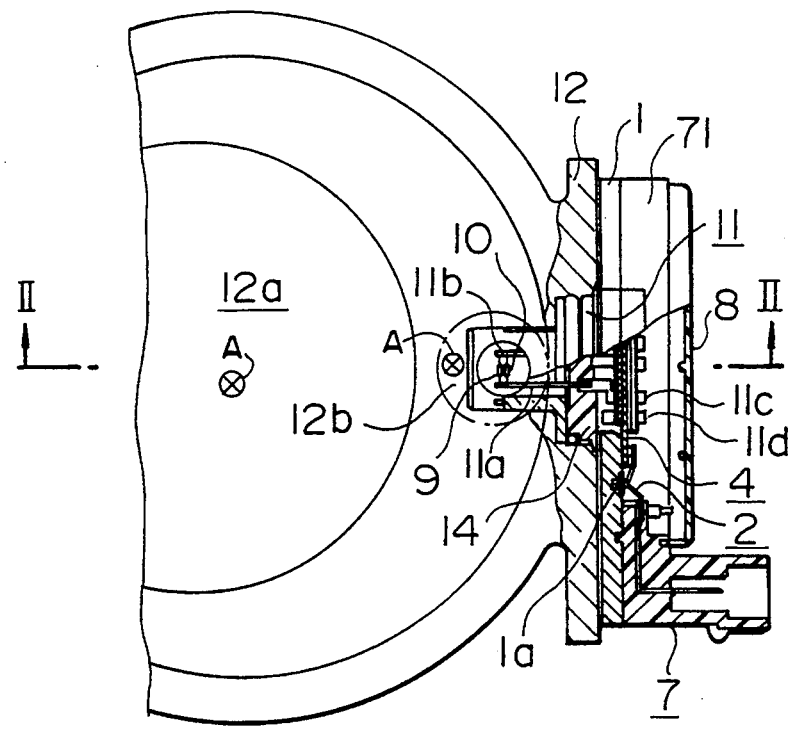
FIG. 1 is a view partially in cross section showing the arrangement of one embodiment in which the present invention is applied to an apparatus for measuring a flow rate of inflow air of an internal combustion engine.
Figure 2:
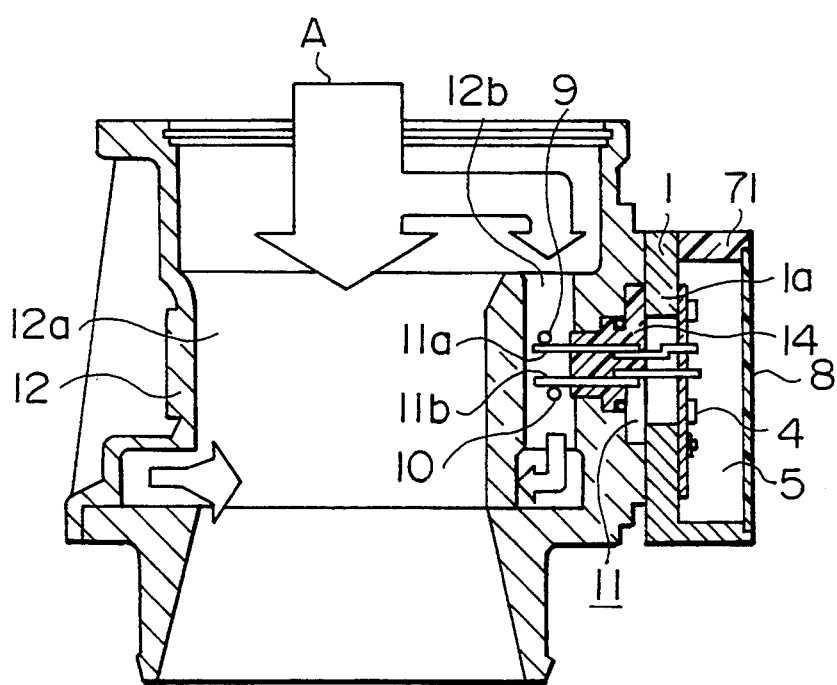
FIG. 2 is a cross sectional view taken on the line II—II of FIG. 1.
Figure 3:
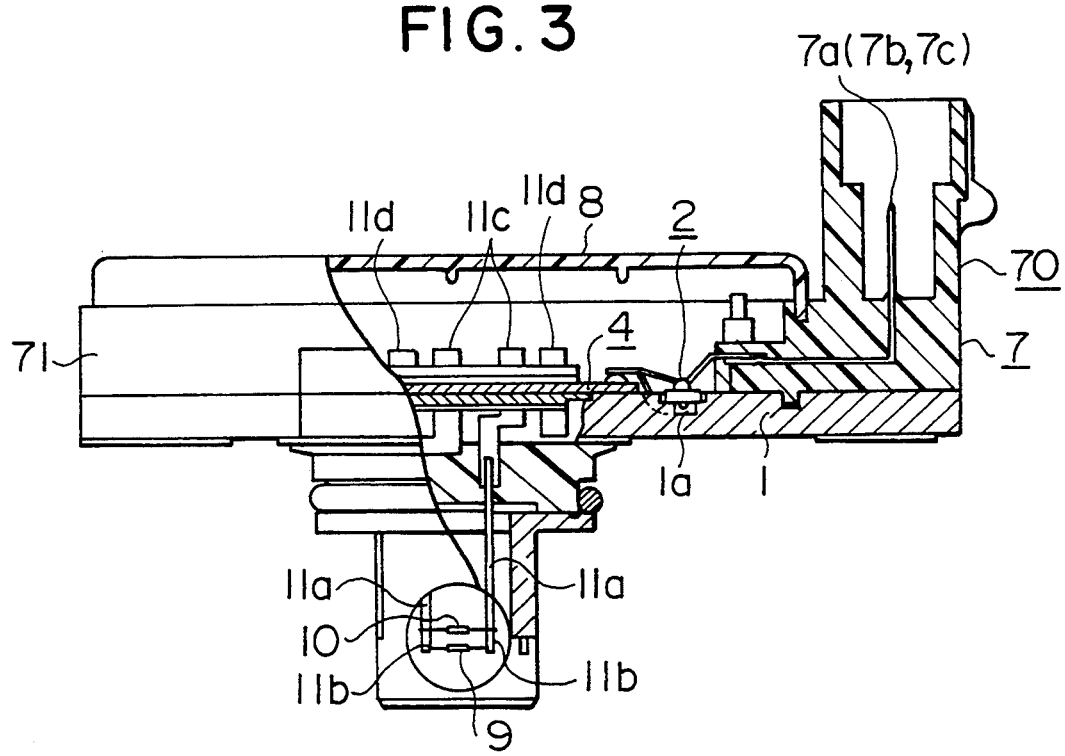
FIG. 3 is an enlarged view partially in cross section showing the apparatus for measuring a flow rate of inflow air shown in FIG. 1.
Figure 4:
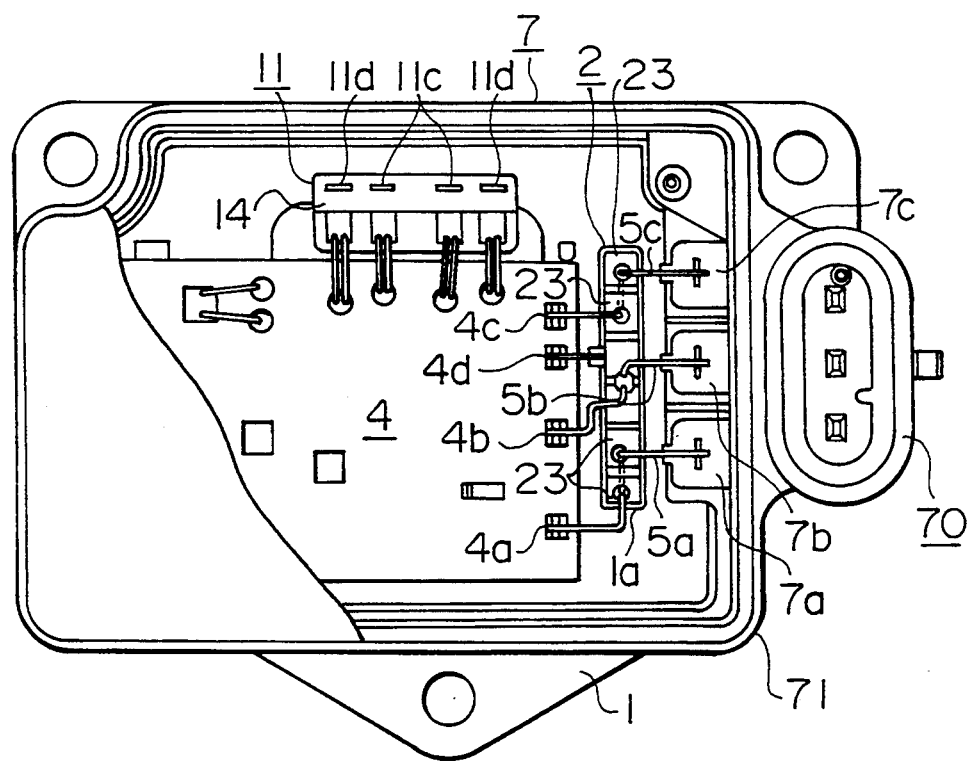
FIG. 4 is a plan view showing the apparatus for measuring a flow rate of inflow air, a cover thereof being broken away.
Figure 5:
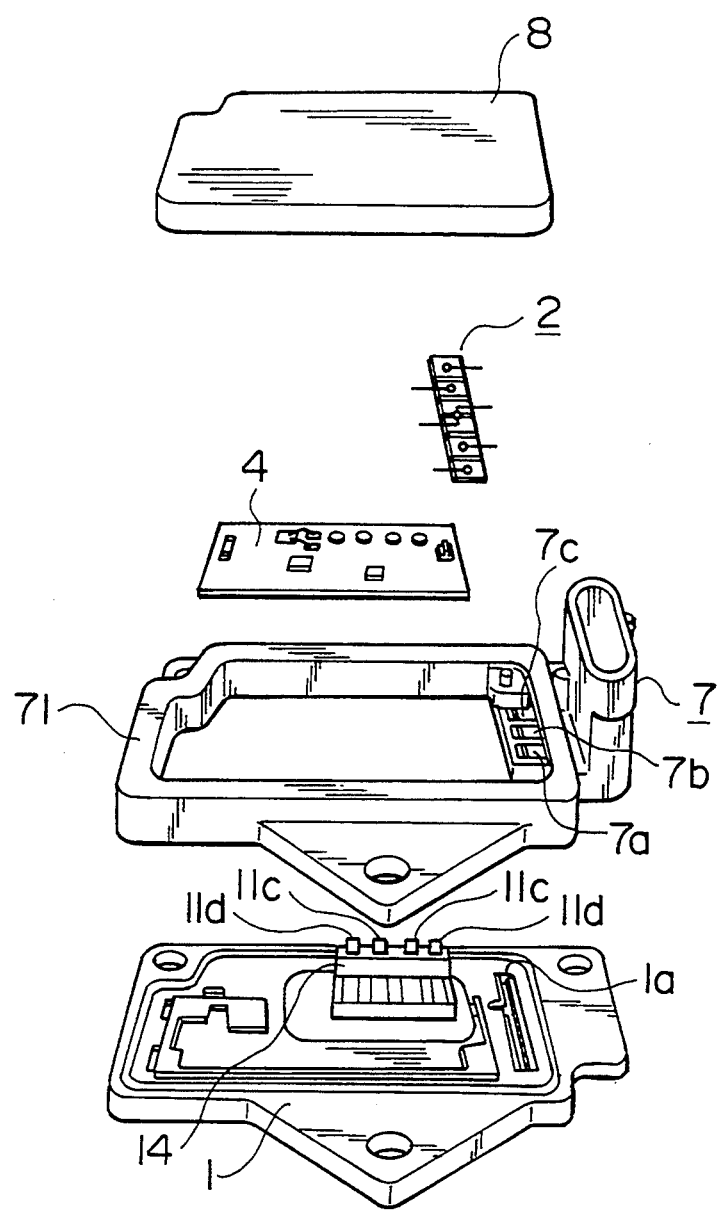
FIG. 5 is an exploded perspective view useful in explaining a method of assembling the apparatus for measuring a flow rate of inflow air.

FIG. 1 is a view partially in cross section showing the arrangement of one embodiment in which the present invention is applied to a hot-wire air flow meter. In the figure, the reference numeral 12 designates a body of a flow meter which is made of aluminium die casting and forms a passage for air A the flow rate of which is to be measured. The flow meter body 12 is made up of a main air passage 12a and a bypass passage 12b. In the bypass passage 12b, a hot-wire resistor 9 and a temperature sensing resistor 10, which form part of a flow rate detection device, are supported by a pair of left and right supporting pins 11a and 11b. Each supporting pin is connected to one of the terminals 11c and 11d which are provided so as to extend to a circuit substrate which will be described later.

The reference numeral 1 designates a metallic base which is made of aluminium die casting. Supporting pins 11a and 11b, and terminals 11c and 11d, are held by a supporting molded member 14, which is formed as the basic member of the metallic base 1, and the terminals and pins serve to connect the hot-wire resistor 9 and the temperature sensing resistor 10 to a predetermined circuit pattern of a circuit substrate 4. Those elements form an element assembly 11.

The circuit substrate 4 is directly mounted to the metallic base 1 by attaching its rear face thereto for example.

Therefore, according to the present embodiment, since a flow rate detection unit and a detection circuit unit are constructed integrally with each other with the metallic base as the base member, the air flow meter can be assembled by only mounting the detection circuit assembly, which includes the metallic base 1, as a unit to the flow meter body 12.

On the surface of the metallic base 1, a recess portion 1a is formed just beside an I/O terminal portion of the circuit substrate.

A flat feedthrough ceramic capacitor assembly 2 is inserted into the recess portion 1a so as to be fixed therein.

A capacitor assembly 2 forms a π type filter for removing electromagnetic wave noise in combination with a lead.

Figure 6:
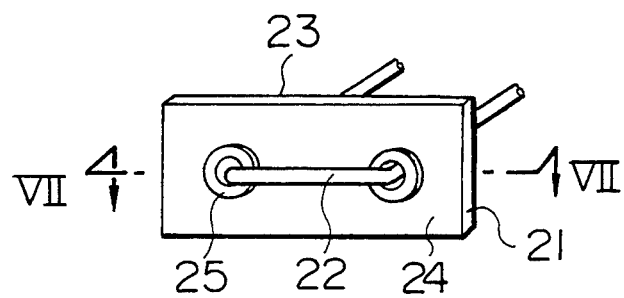
FIG. 6 is a partially enlarged view showing a filter portion.

FIG. 6 is a partially enlarged view showing the construction of one example of the π type filter. The π type filter is made up of a pair of flat feedthrough ceramic capacitors 21 which have an integral one-piece construction, and a lead 22 through which the pair of flat feedthrough ceramic capacitors are connected. Both sides of the feedthrough ceramic capacitor pair have respective electrodes. In this connection, the integral construction of the two feedthrough ceramic capacitors is realized in such a way that one electrode 23 is divided into two electrodes and the other electrode 24 is grounded to the metallic base 1. The lead 22 is inductive (a reactance component). The feedthrough ceramic capacitors are connected to the one end of the lead 22 with solder 26, thereby to constitute a π type filter. The reference numeral 25 designates a resist.

A frame, 7 which is made of a resin material and is installed on the metallic base 1, is made up of a connector portion 70 and a housing 71 for surrounding the control circuit member. In the connector portion 70, connector terminals 7a, 7b and 7c, each of which is made of metal, are formed integrally with one another by molding. Then, the connector terminals 7a, 7b and 7c are connected to predetermined terminal pads 4a to 4d of the circuit substrate 4 through leads 5a to 5c passing through central holes of the feedthrough ceramic capacitors 2.

The reference numeral 8 designates a cover which is mounted to the upper side of the side wall of the housing 71 by an adhesive and serves to protect the inside portion.

The connector terminals 7a and 7b are respectively connected as an output signal terminal and a ground terminal to the external circuit. The connector terminal 7c acts as a power input terminal.

The reference numerals 4a, 4b and 4c respectively designate a pad for the signal input terminal, a pad for the ground terminal, and a pad for the power input terminal.

Figure 8:
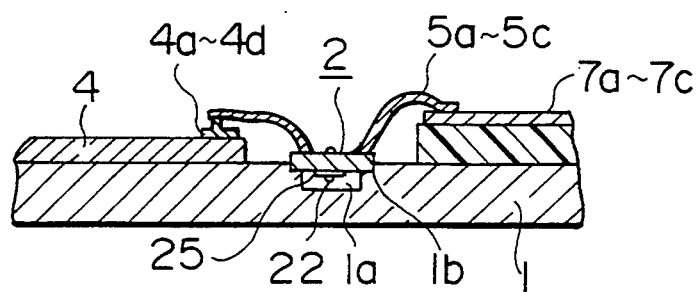
FIG. 8 is a cross sectional view useful in explaining a filter mounting state.

FIG. 8 is a cross sectional view useful in explaining a state in which the flat feedthrough ceramic capacitors are mounted in a groove of the metallic base 1. In the metallic base 1, there are shown a positioning back facing 1b which is used for mounting the flat feedthrough ceramic capacitors thereto, and the lead 22 which constitutes the filter and is formed by the metal lead 5. In this connection, the metallic base 1 and the filter are connected to each other with a conductive adhesive is as to be grounded. Thus, if the above metallic base 1 is employed, after the circuit substrate 4, the connector portion 70 and the feedthrough ceramic capacitor assembly 2 have been mounted, the wiring can be performed. Moreover, since all of the assemblies can be mounted from above in a downward direction, automatic assembly can be readily performed.

Figure 9:
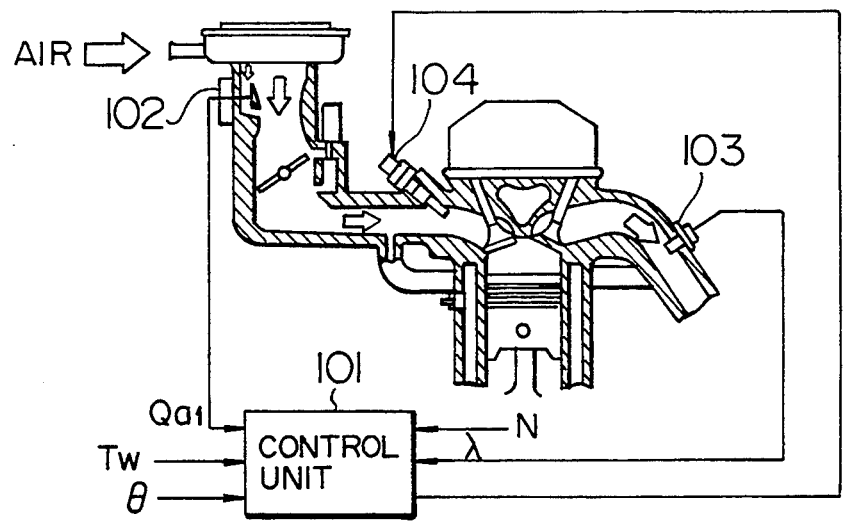
FIG. 9 is a view partially in cross section showing the arrangement of an engine control system employing the apparatus for measuring a flow rate of inflow air shown in FIG. 1 to FIG. 5.

FIG. 9 is a view partially in cross section showing the arrangement of an engine control system employing the hot-wire air flow meter according to the present embodiment. To a control unit 101 is supplied information data, such as an air flow signal $Q_{a1}$ from a hot-wire air flow meter 102, the number of revolutions of the engine N, the concentration $\lambda$ of oxygen in the exhaust gas from an $Q_2$ sensor 103, the temperature Tw of the engine cooling water, and the aperture $\theta$ of the throttle. On the basis of that information data, the control unit 101 calculates the optimal quantity of fuel, thereby to supply the fuel to an injector 104. According to the present embodiment, even in the vicinity of the large output-wireless telegraphic apparatus, it is possible to prevent a malfunction of the electronic circuit. Therefore, there is provided an effect in which an accident resulting from run away or stopping of the engine can be prevented.

Figure 7:
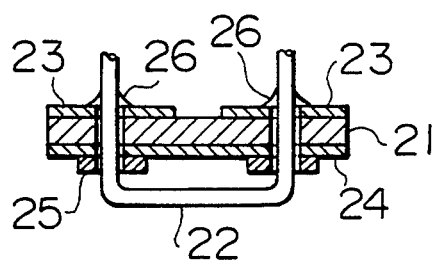
FIG. 7 is a cross sectional view taken on the line VII—VII of FIG. 6.
Figure 10:
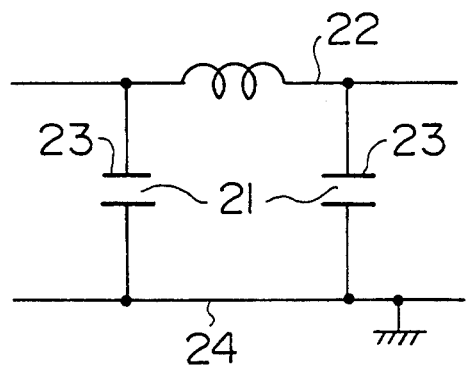
FIG. 10 is a circuit diagram showing an electric equivalent circuit of the filter shown in FIG. 6 and FIG. 7.
Figure 11:
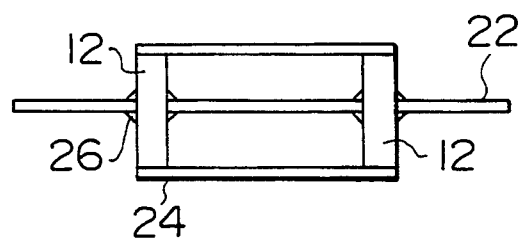
FIG. 11 is a cross sectional view showing the arrangement of another embodiment of the filter.

FIG. 10 is a circuit diagram showing an electric equivalent circuit of the filter shown in FIG. 6, FIG. 7 and FIG. 11. The large filter is made up of an inductive lead 22 and an insulator (dielectric) 21.

FIG. 11 is a cross sectional view showing the arrangement of another embodiment in which a $\pi$ type filter is constructed using the generally used round feedthrough ceramic capacitors. In the present embodiment, a pair of round feedthrough ceramic capacitors are connected to each other by a peripheral electrode 24, thereby to provide the same effect as in the filter employing the flat feedthrough ceramic capacitors shown in FIG. 6.

Figure 12:
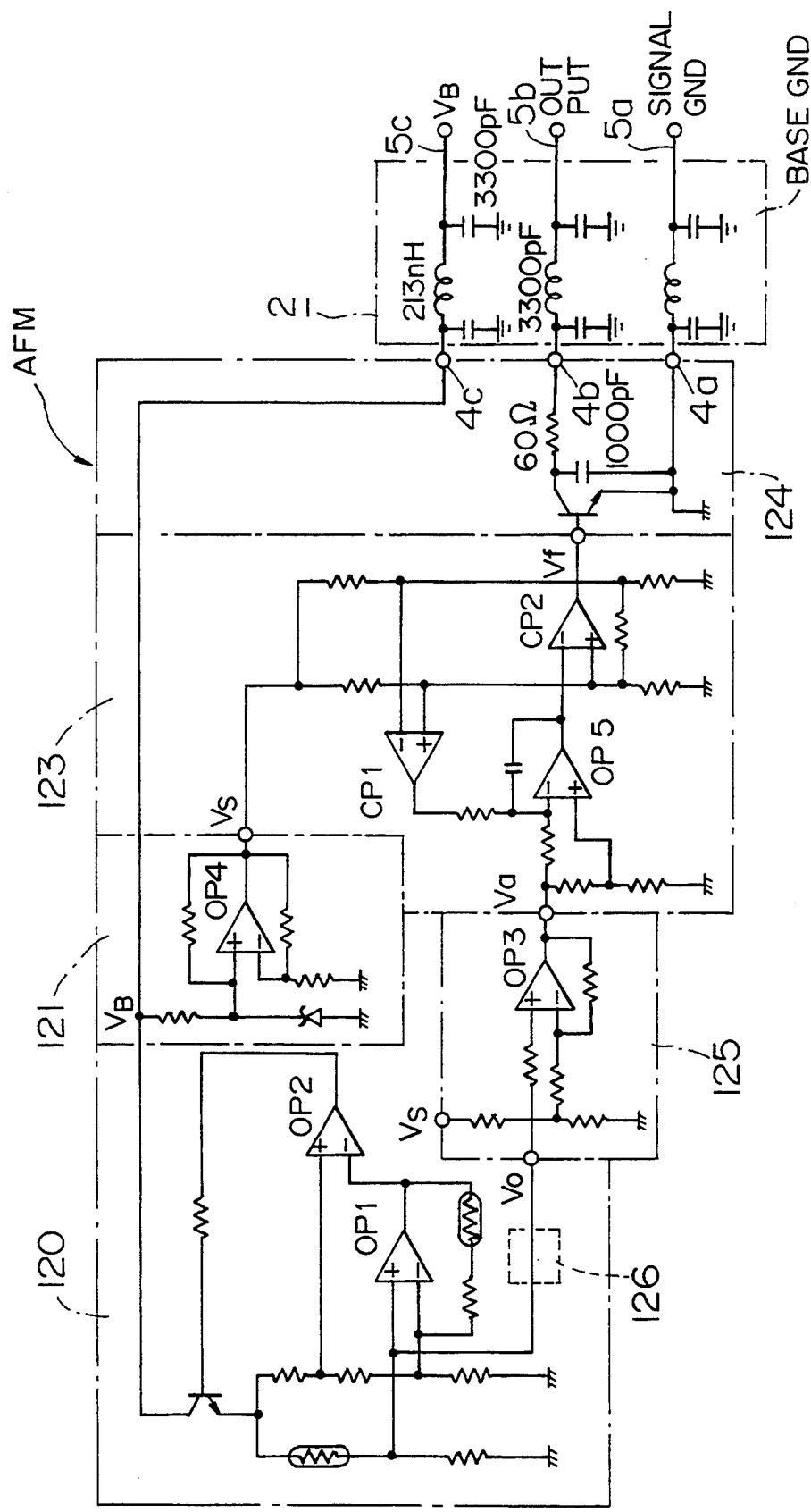
FIG. 12 is a circuit diagram showing an electronic circuit of the apparatus for measuring a flow rate of inflow air shown in FIG. 1 to FIG. 5.
Figure 13:
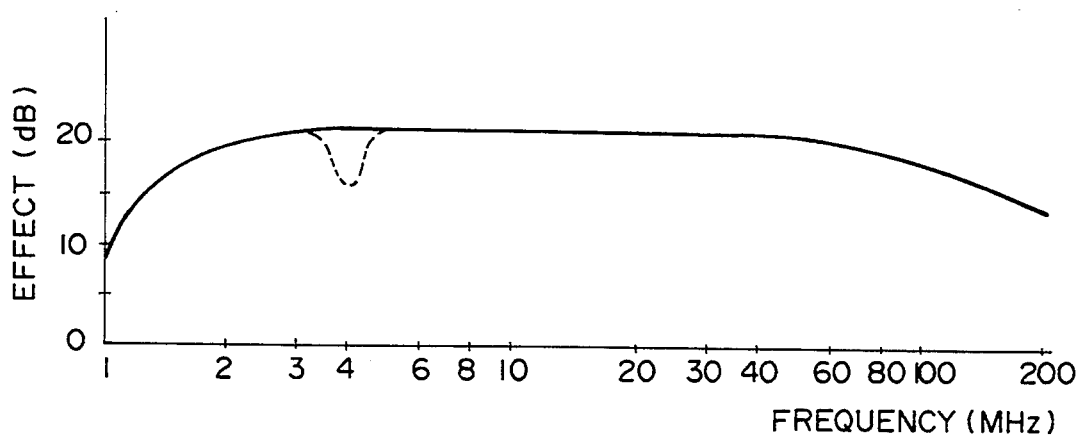
FIG. 13 is a graphical representation showing the effect of the embodiment of FIG. 12.

FIG. 12 is a circuit diagram showing an electronic circuit of the hot-wire air flow meter according to the present embodiment. The electronic circuit is made up of a hot-wire control circuit 120, a constant voltage power supply 121, a voltage controlled oscillator 123, a characteristic adjusting circuit 125, and a buffer 124. In the present embodiment, into an I/O unit 2 is incorporated, the $\pi$ type filter having the effect of removing radio wave trouble is as shown in FIG. 13. Especially, in the present embodiment, the constant values of the RC filter of the buffer 124 are optimally selected to improve the degradation of the characteristics near the frequency of 4 MHz (shown by a dotted line).

Figure 14:
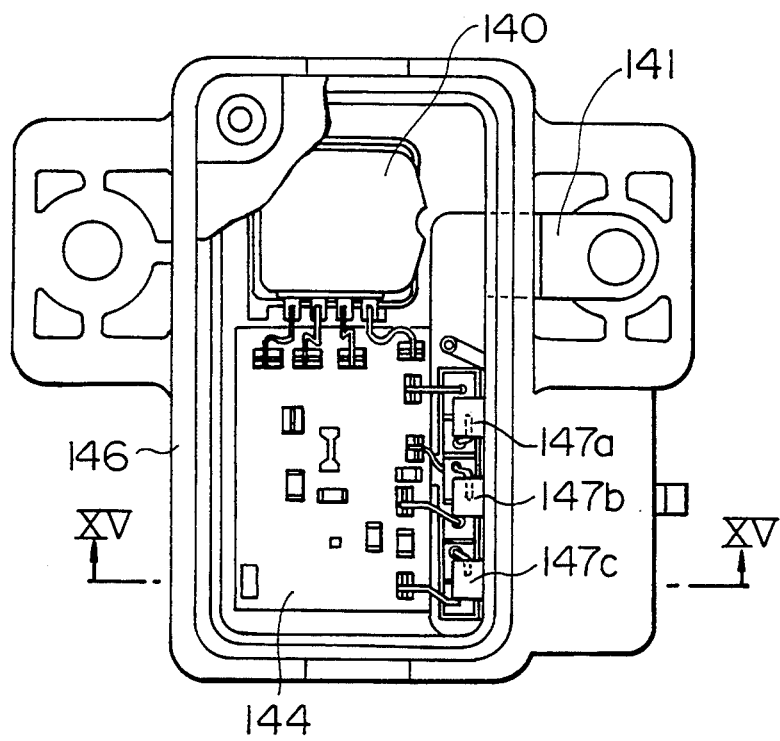
FIG. 14 is a plan view showing the arrangement of still another embodiment in which the present invention is applied to a pressure sensor, a part being broken away for clearness.
Figure 15:
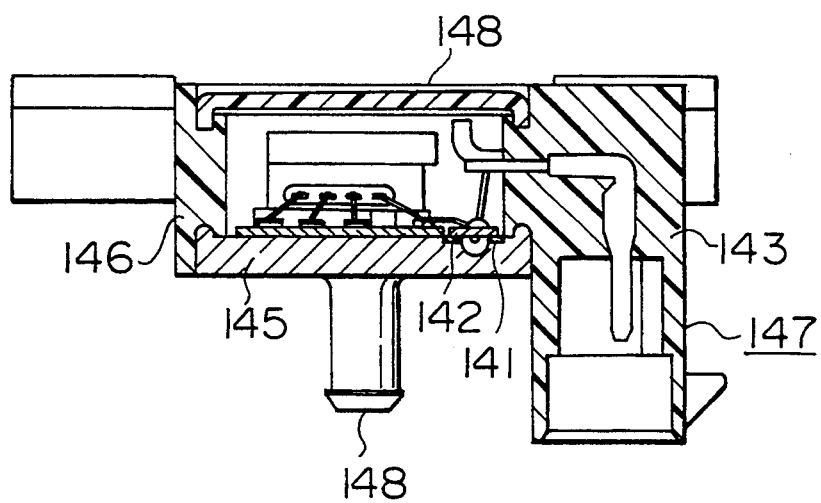
FIG. 15 is a cross sectional view taken on the line XV—XV of FIG. 14.

FIG. 14 and FIG. 15 are views each showing the arrangement of still another embodiment of the present invention in which the $\pi$ type filter is constructed using the flat feedthrough ceramic capacitors, and also a semiconductor pressure sensor is employed. The present embodiment is made up of a pressure detection unit 140, a control circuit 144 and a resin casing 146. In those figures, the reference numeral 147 designates an I/O terminal, and the reference numeral 141 designates a grounding plate for guiding the grounded portion of the feedthrough ceramic capacitors to the body ground.

FIG. 15 is a cross sectional view taken on the line XV—XV of FIG. 14. In the same manner as in the hot-wire air flow meter, all of the assemblies can be mounted from above in a downward direction. Moreover, an effect which is more than or equal thereto can be expected.

What is claimed is:

1. An electronic circuit apparatus comprising an electronic circuit .having a circuit substrate, and a flat metallic base for accommodating said electronic circuit and on which said circuit substrate is mounted, wherein said flat metallic base has a groove in one of its surfaces for mounting a flat feedthrough ceramic capacitor therein, said flat feedthrough ceramic capacitor having one electrode in contact with a portion of said metallic base in said groove so that said one electrode is grounded to said metallic base.

2. An electronic circuit apparatus comprising an electronic circuit, and a noise removing unit provided between said electronic circuit and an I/O terminal thereof, wherein said noise removing unit includes at least one pair of flat feedthrough ceramic capacitors and a lead having an inductive component passing through an aperture in each capacitor of said pair of capacitors so as to make electrical contact with one corresponding electrode of each capacitor;

wherein said pair of feedthrough ceramic capacitors comprises:

a flat rectangular insulating member having a pair of through-holes;

a pair of first electrodes disposed on one surface of said insulating member in spaced relationship so as to surround respective ones of said pair of through-holes; and a second electrode disposed on a surface of said insulating member opposite said one surface so as to form a common electrode in capacitive relation to said pair of first electrodes;

said lead having an inductive component being threaded through said pair of through-holes and being connected electrically only to said pair of first electrodes.

3. An electronic circuit apparatus comprising an electronic circuit, and a noise removing unit provided between said electronic circuit and an I/O terminal thereof, wherein Said noise removing unit includes filter means, comprising at least one pair of feedthrough ceramic capacitors and a lead having an inductive component passing through an aperture in each capacitor of said pair of capacitors so as to make electrical contact with one corresponding electrode of each capacitor, for filtering noise in a signal passing therethrough from said electronic circuit to said I/O terminal;

wherein said pair of feedthrough ceramic capacitors comprises:

a flat rectangular insulating member having a pair of through-holes;

a pair of first electrodes disposed on one surface of said insulating member in spaced relationship so as to surround respective ones of said pair of through-holes; and a second electrode disposed on a surface of said insulating member opposite said one surface so as to form a common electrode in capacitive relation to said pair of first electrodes;

said lead having an inductive component being threaded through said pair of through-holes and being connected electrically only to said pair of first electrodes.

* * * * *